United States Patent
Lee et al.

(10) Patent No.: US 9,189,443 B2
(45) Date of Patent: Nov. 17, 2015

(54) CIRCUIT STRUCTURE ON FLEXIBLE PRINTED CIRCUIT SUBSTRATE HAVING ONE END WITH SHAPE CORRESPONDING TO SIM CARD AND ANOTHER END CORRESPONDING TO MICROSD MEMORY CARD IN SHAPE

(71) Applicant: GOTrust Technology Inc., Taichung (TW)

(72) Inventors: Tien Chi Lee, Taichung (TW); Jeng Lung Li, Taichung (TW)

(73) Assignee: GOTrust Technology Inc., Taichung (TW)

( * ) Notice: Subject to any disclaimer, the term of this patent is extended or adjusted under 35 U.S.C. 154(b) by 187 days.

(21) Appl. No.: 14/027,177

(22) Filed: Sep. 14, 2013

(65) Prior Publication Data
US 2014/0094222 A1  Apr. 3, 2014

(30) Foreign Application Priority Data

Sep. 28, 2012  (TW) .............................. 101218936 U (51) Int. Cl.
| | |
|---|---|
| H04B 1/38 | (2015.01) |
| G06F 13/40 | (2006.01) |
| H05K 1/11 | (2006.01) |
| G06K 19/07 | (2006.01) |
| H05K 3/32 | (2006.01) |

(52) U.S. Cl.
CPC ........ G06F 13/4068 (2013.01); G06K 19/0727 (2013.01); H05K 1/118 (2013.01); H05K 1/116 (2013.01); H05K 3/325 (2013.01)

(58) Field of Classification Search
CPC . H04W 8/24; G06F 13/4068; G06K 19/0727; H05K 1/118; H05K 1/116; H05K 3/325
USPC ........... 455/558; 257/E23.004, E23.105, 701, 257/702, 707, 711, 712, 774, 780; 324/750.3; 439/631, 638
See application file for complete search history.

(56) References Cited

U.S. PATENT DOCUMENTS

| | | | | |
|---|---|---|---|---|
| 6,720,651 | B2 * | 4/2004 | Gaku et al. | 257/707 |
| 7,572,152 | B2 * | 8/2009 | Mosek et al. | 439/631 |
| 2010/0201393 | A1 * | 8/2010 | Quercia et al. | 324/763 |

* cited by examiner

*Primary Examiner* — Amancio Gonzalez
(74) *Attorney, Agent, or Firm* — Muncy, Geissler, Olds & Lowe, P.C.

(57) ABSTRACT

A circuit structure is utilized in circuit connection in a hand-held mobile communication device. The circuit structure is enabled to interconnect electrically a SIM (Subscriber Identity Module) card with a microSD (Secure Digital) memory card installed in the hand-held mobile communication device to enhance transmission of signal and data therebetween.

9 Claims, 8 Drawing Sheets

CIRCUIT STRUCTURE ON FLEXIBLE PRINTED CIRCUIT SUBSTRATE HAVING ONE END WITH SHAPE CORRESPONDING TO SIM CARD AND ANOTHER END CORRESPONDING TO MICROSD MEMORY CARD IN SHAPE

CROSS-REFERENCES TO RELATED APPLICATIONS

This application claims the priority of Taiwanese Patent application No. 101218936, filed on Sep. 28, 2012, which is incorporated herewith by reference.

BACKGROUND OF THE INVENTION

1. Field of the Invention

The present invention relates to a circuit structure, more particularly to a circuit structure that is adapted to be implemented in circuit connection of a hand-held mobile communication device and that enhances electrical connection between a SIM (Subscriber Identity Module) card and a mircroSD (Secure Digital) memory card installed in the hand-held mobile communication device.

2. Description of the Prior Art

Due to rapid advance in the telecommunication technology and ceaseless development in the wireless digital signal transmission, a hand-held communication device or mobile phone becomes more prevalent day by day. It can also perform mobile financial transaction on-lines. For instance, the user can surf the desired webpage including on-line shopping lists over the screen, can perform on-line purchase at a desired shop and on-line payment service. Hence, some mobile-phone manufacturers have provided a sort of payment services so that a mobile phone has become an indispensable instrument for conducting contactless payment, on-line payment service or on-line financial transaction among ATM (Automatic Teller Machine) or POS (Point of Sale) with the use of a credit card after purchase of an item.

It is noted that NFC (Near field Communication) standards is utilized in mobile phones so that the mobile phones of late can perform mobile payment service or request for verification of an individual identification information. A mobile phone utilizing set of standards of NFC is generally known as NFC mobile phone via which contactless payment services can be performed.

Presently, during the mass production process, some mobile phones are provided with built-in software, hardware and/or firmware having NFC function ability depending on the requirement of the mobile user modes. Alternately, some mobile phones are installed with SWP (Single Wire Protocol) SIM card adapted to complement with NFC functionality. If the mobile phone is not installed with NFC-enabled SWP SIM card, said NFC mobile phone is unable to perform the corresponding services. In other word, the NFC mobile phone of late is unable to satisfy the demand of the user and the user cannot perform the selected and desired services according to his or her requirements.

It is therefore highly desired to develop a mobile communication device or a mobile phone that can satisfy the demand of those users, who need multiple communication functions as well as NFC services, such as mobile payment services and verification of an individual identification information on-line.

SUMMARY OF THE INVENTION

Therefore, the objective of the present invention is to provide a circuit structure that is utilized in circuit connection of a hand-held mobile communication device, that interconnects electrically a SIM card and a microSD memory card and that enhances inter transmission of signal and/or data therebetween in the mobile communication device.

Another objective of the present invention is to provide a circuit structure to be implemented in a mobile communication device such that the device possesses NFC SWP function ability so that once the NFC function in a SIM card and a microSD memory card are configured and utilizing the circuit structure of the present invention to interconnect the two cards, the user of the mobile communication device can conduct mobile payment service (on-line financial transaction) in a safety manner owing to able to identification of an individual financial information.

The circuit structure of the present invention accordingly includes a first connection circuit, a second connection circuit and a conduction circuit, The first connection circuit is fabricated on one side surface of a flexible printed circuit substrate and is formed with a plurality of SIM-host contacts for electrically contacting insert slots of a SIM (Subscriber Identity Module) card respectively once the latter is inserted thereinto. The first connection circuit is further formed with a plurality of card-contact points for electrically connecting a mircroSD memory card once inserted thereinto.

The second connection circuit is fabricated on the other side surface of the flexible printed circuit substrate and is formed with a plurality of SIM-host contacts for electrically contacting the SIM card once the latter is inserted thereinto. The second connection circuit is further formed with the plurality of card-contact points for electrically connecting the microSD memory card once inserted thereinto.

The conduction circuit is formed in the flexible printed circuit substrate in such a manner to electrically interconnect the first and second connection circuits.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENTS

Figure 1:
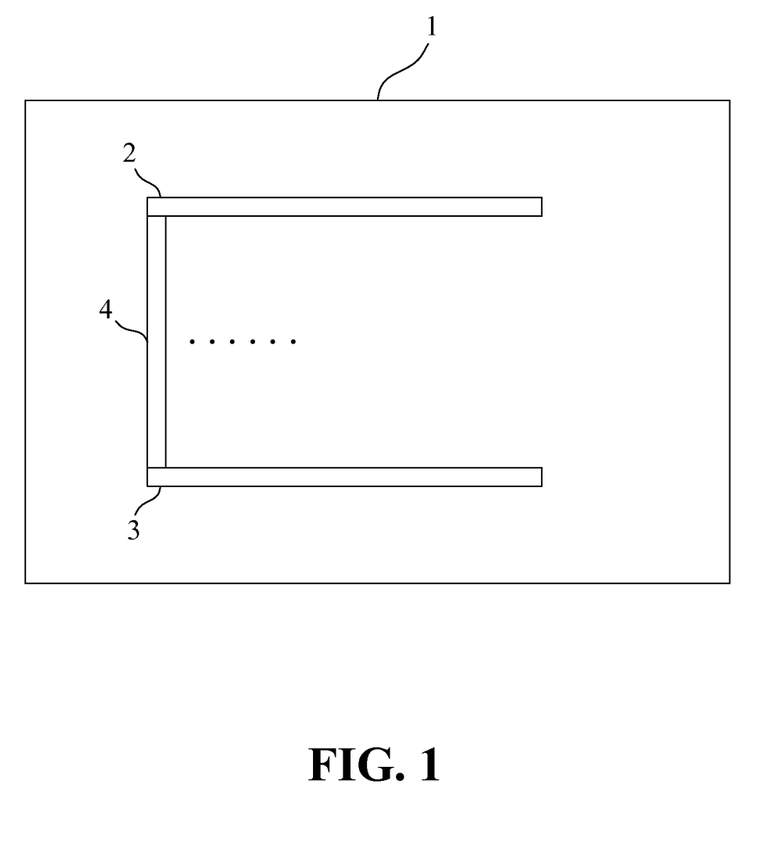
FIG. 1 illustrates a circuit structure of the present invention.

FIG. 1 illustrates a circuit structure of the present invention. As illustrated, the circuit structure 1 of the present invention can be implemented in circuit connection of a hand-held mobile communication device (hereinafter mobile phone); and the circuit structure 1 includes a first connection circuit 2, a second connection circuit 3 and a conduction circuit 4.

The first connection circuit 2 is fabricated on one side surface 51 of a flexible printed circuit substrate 5 (see FIG. 2), and is formed with a plurality of SIM-host contacts (not visible) for electrically contacting insert slots of a SIM (Subscriber Identity Module) card (not visible) respectively. The first connection circuit 2 further is formed with a plurality of card-contact points (not visible) for electrically connecting a mircoSD (Secure Digital) memory card (not visible).

The second connection circuit 3 is fabricated on the other side surface 52 of the flexible printed circuit substrate 5 (see FIG. 2), and is formed with a plurality of SIM-host contacts (not visible) for electrically contacting the insert slots of the SIM card (not visible) respectively. The second connection circuit 3 is further formed with the plurality of card-contact points (not visible) for electrically connecting with the microSD memory card (not visible).

The conduction circuit 4 interconnects electrically the first and second connection circuits 2, 3.

In this embodiment, the flexible printed circuit substrate 5 is formed with a conduction hole that defines the conduction circuit 4. The flexible printed circuit substrate 5 is implemented in the mobile communication device, such as a smart phone, tablet PC or tablet computer.

Figure 2:
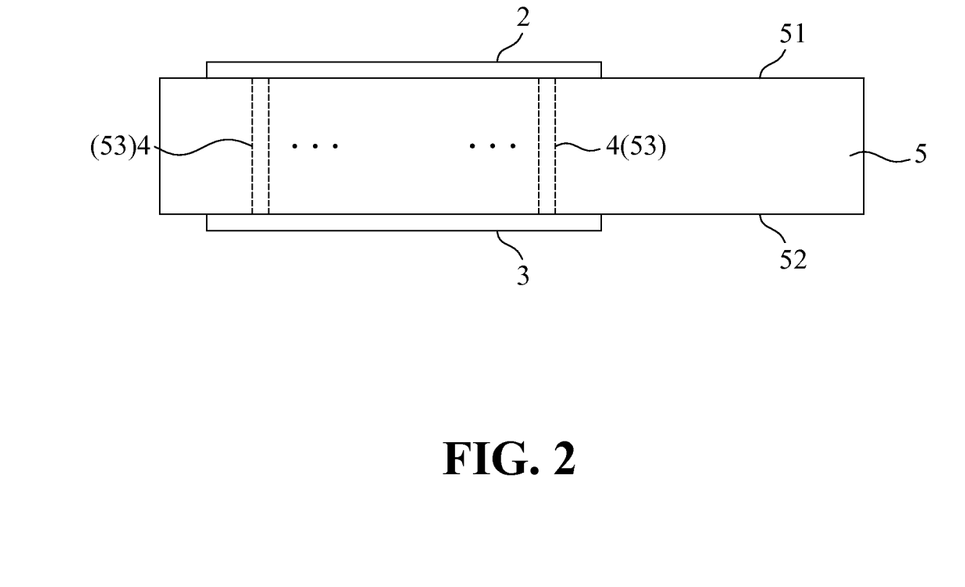
FIG. 2 is a lateral side view illustrating the circuit structure of the present invention.

FIG. 2 is a lateral side view illustrating the circuit structure 1 of the present invention. As illustrated, the circuit structure 1 includes the first connection circuit 2, the second connection circuit 3 and the conduction circuit 4.

The flexible printed circuit substrate 5 is implemented in a mobile communication device (not visible), such as a smart phone, tablet PC or tablet computer.

The first connection circuit 2 is fabricated on one side surface 51 of a flexible printed circuit substrate 5, and is formed with a plurality of SIM-host contacts 201, 202, 203, 204, 205, 206 (see FIG. 3) for electrically connected with the insert slots of the SIM card. The first connection circuit 2 further is formed with a plurality of card-contact points 207, 208 (see FIG. 3) for electrically connecting with the insert slots of a microSD memory card (not visible). In this embodiment, the SIM-host-contacts 201, 203, 204, 205, 206 of the first connection circuit 2 are electrically connected with the SIM-host contacts 301, 302, 303, 304, 305 of the second connection circuit 3 (see FIG. 4) via the conduction hole (the conduction circuit 4) in the flexible printed circuit substrate 5. Since the contact C6 of a SIM card (not visible) is usually shielded, the second connection circuit 3 is not provided with a SIM-host contact for establishing electrical communication with the contact C6 of the SIM card and hence the SIM-host contact 202 in the first connection circuit 2 is not necessary connected electrically to a corresponding SIM-host contact in the second connection circuit 3. In addition, the card-host contacts 207, 208 of the first connection circuit 2 (see FIG. 3) are electrically connected with the card-contact points 307, 308 of the second connection circuit 3 (see FIG. 4) via the conduction hole (the conduction circuit 4) in the flexible printed circuit substrate 5.

Figure 3:
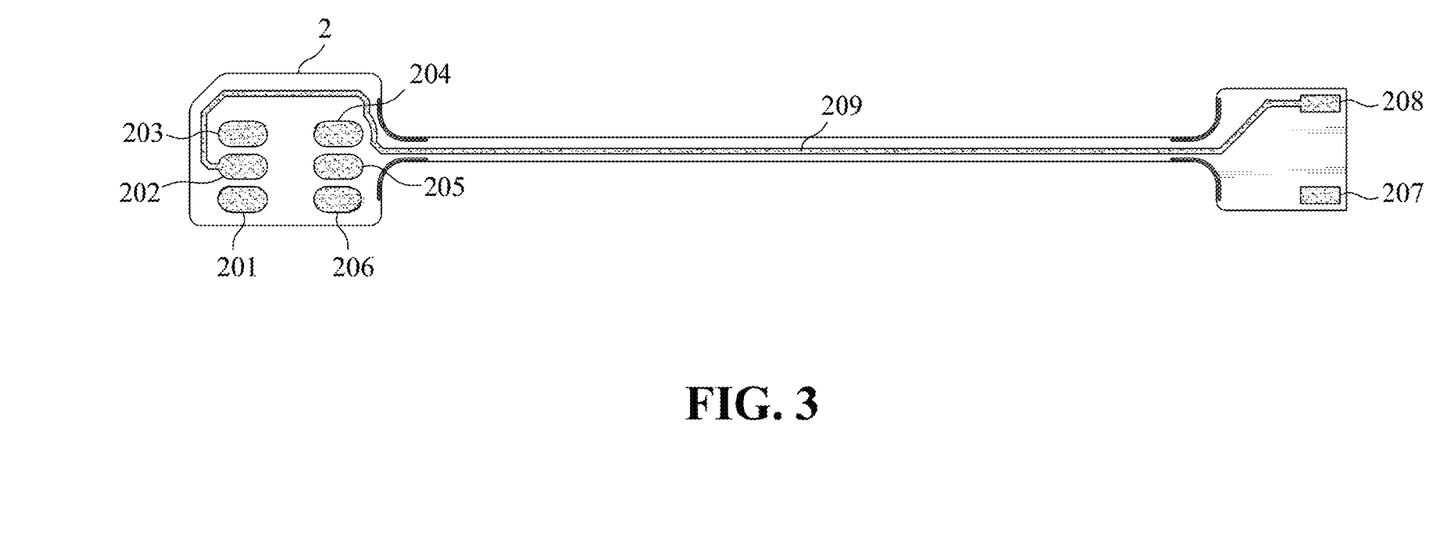
FIG. 3 illustrates a first connection circuit employed in the circuit structure of the present invention shown in FIG. 2.

The second connection circuit 3 is fabricated on the other side surface 52 of a flexible printed circuit substrate 5, and is formed with the plurality of SIM-host contacts 301, 302, 303, 304, 305 (see FIG. 4) for connecting electrically with the insert slots of the SIM card (not visible). The second connection circuit 3 further is formed with a plurality of card-contact points 307, 308 (see FIG. 4) for electrically connecting with the insert slots of a microSD memory card (not visible). In this embodiment, the SIM-host contacts 301, 302, 303, 304, 305 of the second connection circuit 3 are electrically connected with the SIM-host-contacts 201, 203, 204, 205, 206 of the first connection circuit 2 (see FIG. 4) via the conduction hole (the conduction circuit 4) in the flexible printed circuit substrate 5. Since the contact C6 of a SIM card (not visible) is usually shielded, the second connection circuit 3 is not provided with a SIM-host contact for establishing electrical communication with the contact C6 of the SIM card and hence the SIM-host contact 202 in the first connection circuit 2 is not necessary connected electrically to a corresponding SIM-host contact in the second connection circuit 3. In addition, the card-contact points 307, 308 of the second connection circuit 3 (see FIG. 4) are connected electrically with the card-host-contacts 207, 208 of the first connection circuit 2 (see FIG. 4) via the conduction hole (the conduction circuit 4) in the flexible printed circuit substrate 5.

The conduction circuit 4 is fabricated in the flexible printed circuit substrate 5 for interconnecting electrically the first and second connection circuits 2, 3.

FIG. 3 illustrates the first connection circuit 2 employed in the circuit structure 1 of the present invention shown in FIG. 2. As illustrated, the first connection circuit 2 is formed with a plurality of SIM-host-contacts 201, 202, 203, 204, 205, and 206 for connecting electrically with the insert slots of the SIM card once the latter is inserted therein. The first connection circuit 2 further is formed with a plurality of card-contact points 207, 208 for connecting electrically with the insert pins of a microSD memory card (not visible) once the latter is inserted therein. In this embodiment, the SIM-hos-contacts (201, 203, 204, 205, 206) of the first connection circuit 2 are connected electrically with the SIM-host contacts (301, 302, 303, 304, 305) of the second connection circuit 3 (see FIG. 4) via the conduction hole (the conduction circuit 4) in the flexible printed circuit substrate 5. Since the contact C6 of a SIM card (not visible) is usually shielded, the second connection circuit 3 is not provided with a SIM-host contact for establishing electrical communication with the contact C6 of the SIM card and hence the SIM-host contact 202 in the first connection circuit 2 is not necessary connected electrically to a corresponding SIM-host contact in the second connection circuit 3. In addition, the card-contact points 207, 208 of the first connection circuit 2 are connected electrically with the card-contact points 307, 308 of the second connection circuit 3 (see FIG. 4) via the conduction hole (the conduction circuit 4) in the flexible printed circuit substrate 5.

The first connection circuit 2 preferably includes a conduction circuit path 209, which interconnects electrically the SIM-host-contact 202 with the card-contact point 208 so that in the hand-held communication device (such as mobile phone) a SWP signal is transmitted from the SIM-host contact 202 to the card-contact point 208 via the conduction circuit path 209. The SIM-host contact 202 is not necessary connected electrically with the corresponding SIM-host contact in the second connection circuit 3. In other words, the second connection circuit 3 is not provided with a SIM-host contact for establishing electrical communication with the contact C6 of a SIM card in case the latter is inserted thereinto.

Under this condition, the SIM-host contacts 201, 203, 204, 205, 206 of the first connection circuit 2 are electrically connected with the corresponding SIM-host contacts 301, 302, 303, 304, 305 of the second connection circuit 3 (see FIG. 4) via the conduction hole (the conduction circuit 4) in the flexible printed circuit substrate 5 while the card-contact points 207, 208 of the first connection circuit 2 are connected electrically with the corresponding card-contact points 307, 308 in the second connection circuit 3.

Figure 4:
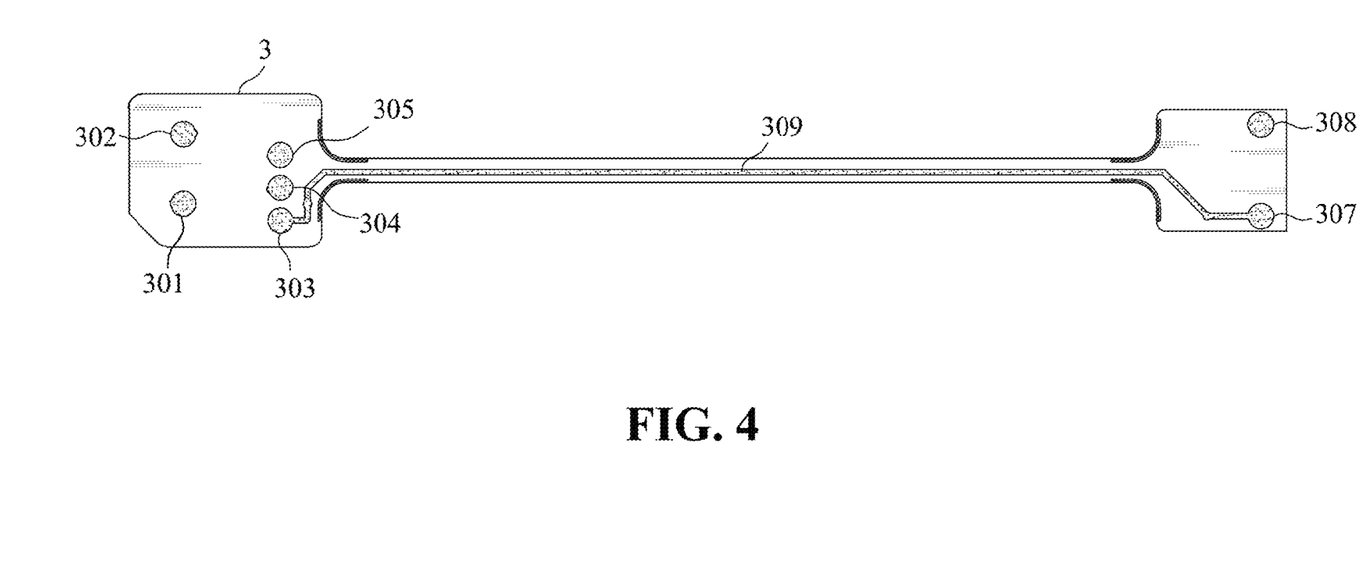
FIG. 4 illustrates a second connection circuit employed in the circuit structure of the present invention shown in FIG. 2.

At this time, since the conduction circuit path 209 interconnects electrically the SIM-host contact 202 with the card-contact point 208 so that in a mobile phone, the SWP signal is transmitted from the SIM-host contact 202 to the card-contact point 208 via the conduction circuit path 209. In the same manner, the SWP signal can be transmitted from the card-host contact 208 to the card-contact point 308 via the conduction hole (the conduction circuit 4) in the flexible printed circuit substrate 5. Since the card-contact point 308 is reserved for contacting electrically with the pin PIN9 of the microSD memory card, so that in a mobile phone, the SWP signal can be transmitted to the PIN9 of the microSD memory card and hence inter transmission of SWP signals and/or data between the SIM card and the microSD memory card can be enhanced in the mobile phone.

FIG. 4 illustrates a second connection circuit employed in the circuit structure of the present invention shown in FIG. 2. As illustrated, the second connection circuit 3 is formed with the plurality of SIM-host contacts 301, 302, 303, 304, 305 for connecting electrically with the insert slots C5, C7, C1, C2, C3 of the SIM card (not visible). The second connection circuit 3 further is further formed with two card-contact points 307, 308 for electrically connecting with the insert PIN10, PIN9 of a microSD memory card (not visible). In this embodiment, the second connection circuit 3 further includes a conduction circuit path 309, which electrically interconnects the SIM-host contact 303 with the card-contact point 307.

Under this condition, the SIM-host contact 206 of the first connection circuit 2 is connected electrically with the corresponding SIM-host contact 303 of the second connection circuit 3 (see FIG. 4) via the conduction hole (the conduction circuit 4) in the flexible printed circuit substrate 5 while the SIM-host contact 303 is connected electrically with the contact C1 (Vcc) of the SIM card (not visible). Since the card-contact point 307 has a signal Vcc, the SIM-host-contact 206 also possesses the signal Vcc and the SIM-host contact 303, being coupled electrically with the PIN 10 of the microSD memory card, also has the signal Vcc so that the signal Vcc can be transmitted to the PIN 10 of the microSD memory card (not visible).

Figure 5:
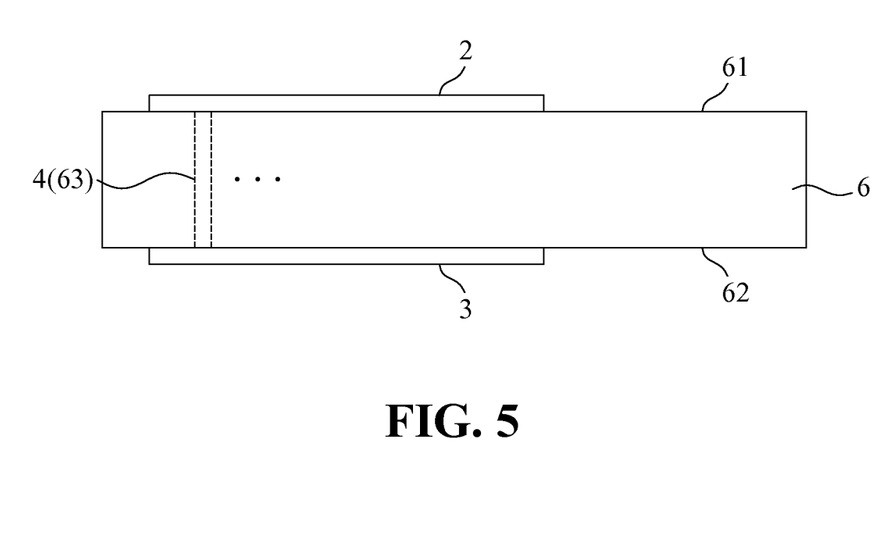
FIG. 5 is a lateral side view illustrating a modified circuit structure of the present invention.

FIG. 5 is a lateral side view illustrating a modified circuit structure of the present invention. As shown, the modified circuit structure 1 includes the first connection circuit 2, the second connection circuit 3 and the conduction circuit 4.

The first connection circuit 2 is fabricated on one side surface 61 of a flexible printed circuit substrate 6 (see FIG. 5), and is formed with a plurality of SIM-host contacts 211, 212, 213, 214, 215, 216 (see FIG. 6) for electrically connecting to the insert slots of a SIM card (not visible). The first connection circuit 2 further is formed with a plurality of card-contact points 317, 318 (see FIG. 6) for electrically connecting with the insert pins of a microSD memory card (not visible). In this embodiment, the SIM-host contacts 211, 213, 214, 215, 216 of the first connection circuit 2 are electrically connected to the SIM-host contacts 311, 312, 313, 314, 315 of the second connection circuit 3 (see FIG. 7) via the conduction circuit 4 in the flexible printed circuit substrate 6. Since the contact C6 of a SIM card (not visible) is usually shielded, the second connection circuit 3 is not provided with a SIM-host contact for establishing electrical communication with the contact C6 of the SIM card and hence the SIM-host contact 212 in the first connection circuit 2 is not necessary connected electrically to a corresponding SIM-host contact in the second connection circuit 3.

The second connection circuit 3 is fabricated on the other side surface 62 of a flexible printed circuit substrate 6, and is formed with the plurality of SIM-host contacts 311, 312, 313, 314, 315 (see FIG. 7) for connecting electrically with the insert pins of a microSD memory card (not visible) once the latter is inserted thereinto. The second connection circuit 3 further is formed with two card-contact points 317, 318 (see FIG. 6). Since the card-contact points 317, 318 and the SIM-host contacts 311, 312, 313, 314, 315 are located on the second connection circuit 3, no other card-contact point is needed in the second connection 3 for establishing electrical connection with a microSD memory card in case the latter is inserted thereto. In this embodiment, the SIM-host contacts 311, 312, 313, 314, 315 of the second connection circuit 3 are electrically connected with the SIM-host-contacts 211, 213, 214, 215, 216 of the first connection circuit 2 via the conduction circuit 4 in the flexible printed circuit substrate 5. Since the contact C6 of a SIM card (not visible) is usually shielded, the second connection circuit 3 is not provided with a SIM-host contact for establishing electrical communication with the contact C6 of the SIM card and hence the second connection circuit 3 is not necessary provided with any SIM-host contact for connected electrically to a corresponding SIM-host contact in the first connection circuit 2.

The conduction circuit 4 is fabricated in the flexible printed circuit substrate 6 for interconnecting electrically the first and second connection circuits 2, 3.

Figure 6:
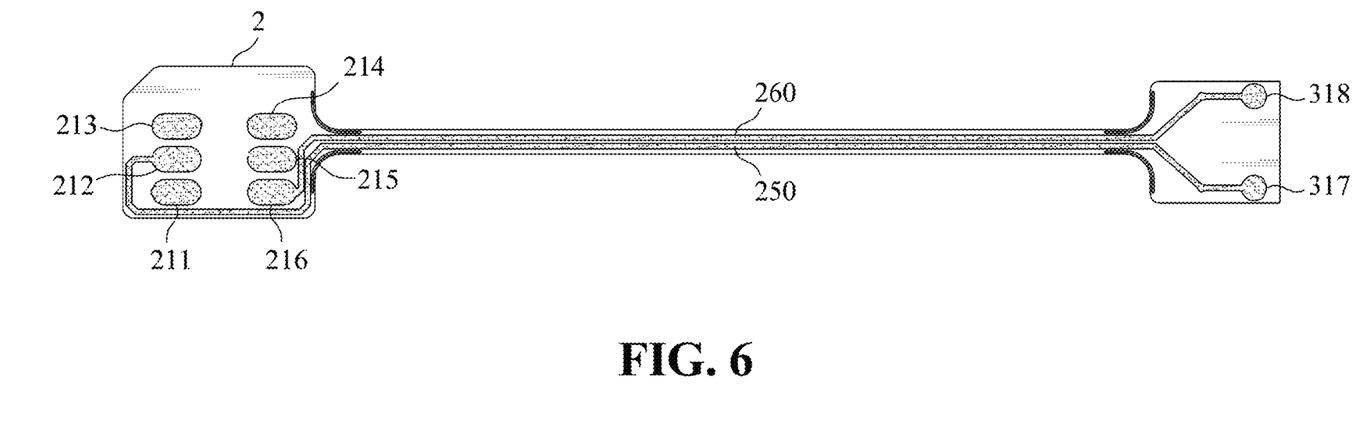
FIG. 6 illustrates a first connection circuit employed in the modified circuit structure of the present invention shown in FIG. 5.

FIG. 6 illustrates the first connection circuit employed in the modified circuit structure of the present invention shown in FIG. 5. The first connection circuit 2 is formed with a plurality of SIM-host contacts 211, 212, 213, 214, 215, 216 for electrically connecting with the insert slots of a SIM card (not visible) once the latter is inserted thereinto. The first connection circuit 2 further is formed with two card-contact points 317, 318 for electrically connecting with a microSD memory card (not visible). In this embodiment, the first connection circuit 2 further includes two conduction circuit paths 250, 260.

Under this condition, the SIM-host contacts 211, 212, 213, 214, 215, 216 of the first connection circuit 2 are electrically connected with the SIM-host contacts 311, 312, 313, 314, 315 of the second connection circuit 3 via the conduction circuit 4 in the flexible printed circuit substrate 6. The first connection circuit 2 further includes two conduction circuit paths 250, 260, wherein the conduction circuit path 250 interconnects electrically the SIM-host contact 212 with the card-contact point 317 so that in a mobile phone, the SWP signal is transmitted from the SIM-host contact 212 to the card-contact point 317 via the conduction circuit path 250. In the same manner, the SWP signal can be transmitted from the card-contact point 317 to the PINS of the microSD memory card (not visible). The conduction circuit path 260 interconnects electrically the SIM-host contact 216 with the card-contact point 318 so that the signal Vcc from the contact point 313 is transmitted the contact C1 of the SIM card (not visible) via the conduction circuit path 260 to the card-contact point 318, which, in turn, transmits the signal Vcc to the PIN10 of the microSD memory card (not visible).

Figure 7:
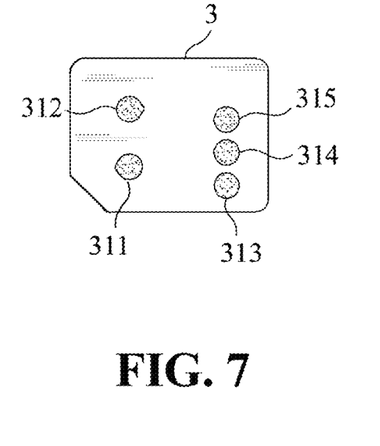
FIG. 7 illustrates a second connection circuit employed in the modified circuit structure of the present invention shown in FIG. 5.

FIG. 7 illustrates a second connection circuit employed in the modified circuit structure of the present invention shown in FIG. 5. The second connection circuit 3 is formed with the plurality of SIM-host contacts 311, 312, 313, 314, 315 for connecting electrically with the SIM card and further two card-contact points 317, 318. Since the card-contact points 317, 318 and the SIM-host contacts 211, 213, 214, 215, 216 are located on the first connection circuit 2, no other card-contact point is needed in the second connection 3 for establishing electrical connection with a microSD memory card (not visible) in case the latter is inserted thereto.

In this embodiment, the SIM-host contacts 311, 312, 313, 314, 315 of the second connection circuit 3 are electrically connected with the SIM-host-contacts 211, 213, 214, 215, 216 of the first connection circuit 2 via the conduction circuit 4 in the flexible printed circuit substrate 5. In addition, the SIM-host contacts 311, 312, 313, 314, 315 of the second connection circuit 3 are connected electrically and respectively with the contacts C5, C7, C1, C2, C3 of the SIM card (not visible).

Figure 8:
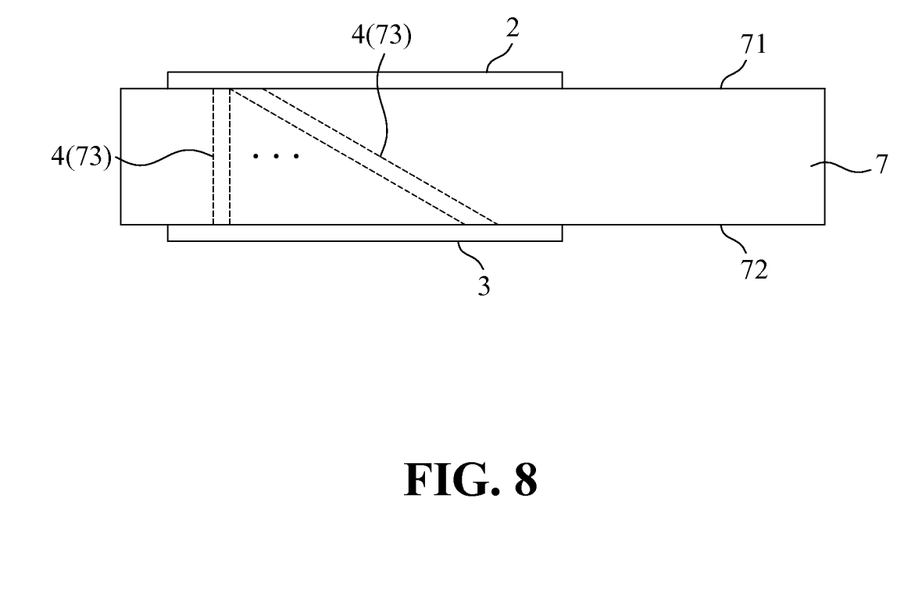
FIG. 8 is a lateral side view illustrating another modified circuit structure of the present invention.

FIG. 8 is a lateral side view illustrating another modified circuit structure of the present invention. As shown, the modified circuit structure 1 includes the first connection circuit 2, the second connection circuit 3 and the conduction circuit 4.

The first connection circuit 2 is fabricated on one side surface 71 of a flexible printed circuit substrate 7, and is formed with a plurality of SIM-host contacts 221, 222, 223, 224, 225, 226 (see FIG. 9) that are used for electrically connected with the insert slots of a SIM card (not visible). The SIM-host contacts 221, 223, 224, 225, 226 are electrically connected with the SIM-contact points 321, 322, 323, 324, 325 of the second connection circuit 3 (see FIG. 10) via the conduction circuit 4 in the flexible printed circuit substrate 7. Since the contact C6 of a SIM card (not visible) is usually shielded, the second connection circuit 3 is not provided with a SIM-host contact for establishing electrical communication with the contact C6 of the SIM card and hence the SIM-host contact 222 of the first connection circuit 2 is not necessary connected electrically to any SIM-host contact in the second connection circuit 3. In a mobile phone, the insert pin PIN9 of the microSD memory card (not visible) is capable of transmitting a SWP signal and since the SIM-host contact 222 and the second connection circuit 3 are electrically connected with the card-contact point 328 via the conduction circuit 4 such that in a mobile phone, the SWP signal is transmitted from the SIM-host contact 222 to the card-contact point 328 via the conduction circuit 4. Because, the card-contact point 328 is in electrical connection with the insert pin PIN9 of the microSD memory card (not visible), the SWP signal is transmitted to the insert pin PIN9, thereby enhancing inter transmission of signal or data between the SIM card and the microSD memory card installed in the mobile phone.

The second connection circuit 3 is fabricated on the other side surface 72 of the flexible printed circuit substrate 7, and is formed with the plurality of SIM-host contacts 321, 322, 323, 324, 325 (see FIG. 10) for connecting electrically with a SIM card (not visible) and two card-contact points 327, 328 (see FIG. 10) for connecting electrically to a microSD memory card (not visible), wherein the SIM-host contacts 321, 322, 323, 324, 325 of the second connection circuit 3 are connected electrically with the SIM-host contacts 221, 223, 224, 225, 226 of the first connection circuit 2 via the conduction hole (the conduction circuit 4). Since the contact C6 of a SIM card (not visible) is usually shielded, the second connection circuit 3 is not provided with a SIM-host contact for establishing electrical communication with the contact C6 of the SIM card and hence the SIM-host contact of the second connection circuit 3 is not necessary connected electrically to any SIM-host contact in the first connection circuit 3

The conduction circuit 4, in the form of a conduction hole 73, is formed through the flexible printed circuit substrate 7 for interconnecting electrically the first and second connection circuits 2, 3.

Figure 9:
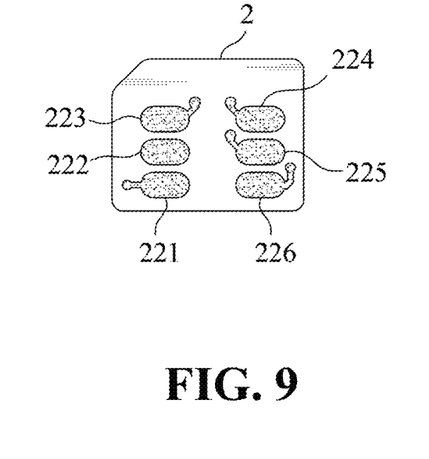
FIG. 9 illustrates a first connection circuit employed in another modified circuit structure of the present invention shown in FIG. 8.

FIG. 9 illustrates a first connection circuit employed in another modified circuit structure of the present invention shown in FIG. 8. As illustrated, the first connection circuit 2 is formed with a plurality of SIM-host contacts 221, 222, 223, 224, 225, 226 that are used for electrically connected with the insert slots of a SIM card (not visible).

Under this condition, the SIM-host contacts 221, 223, 224, 225, 226 of the first connection circuit 2 are electrically connected with the SIM-host contacts 321, 322, 323, 324, 325 of the second connection circuit 3 (see FIG. 10) via the conduction hole (the conduction circuit 4) in the flexible printed circuit substrate 7. Since the contact C6 of a SIM card (not visible) is usually shielded, the second connection circuit 3 is not provided with a SIM-host contact for establishing electrical communication with the contact C6 of the SIM card and hence the SIM-host contact 222 is not necessary connected electrically to any SIM-host contact in the first connection circuit 3. In a mobile phone, the SWP signal is transmitted from the SIM-host contact 222, the card-contact point 328 via the conduction circuit 4. Because, the card-contact point 328 is in electrical connection with the insert pin PIN9 of the microSD memory card (not visible), the SWP signal is transmitted to the insert pin PIN9, thereby enhancing inter transmission of signal and/or data between the SIM card and the microSD memory card installed in the mobile phone.

Figure 10:
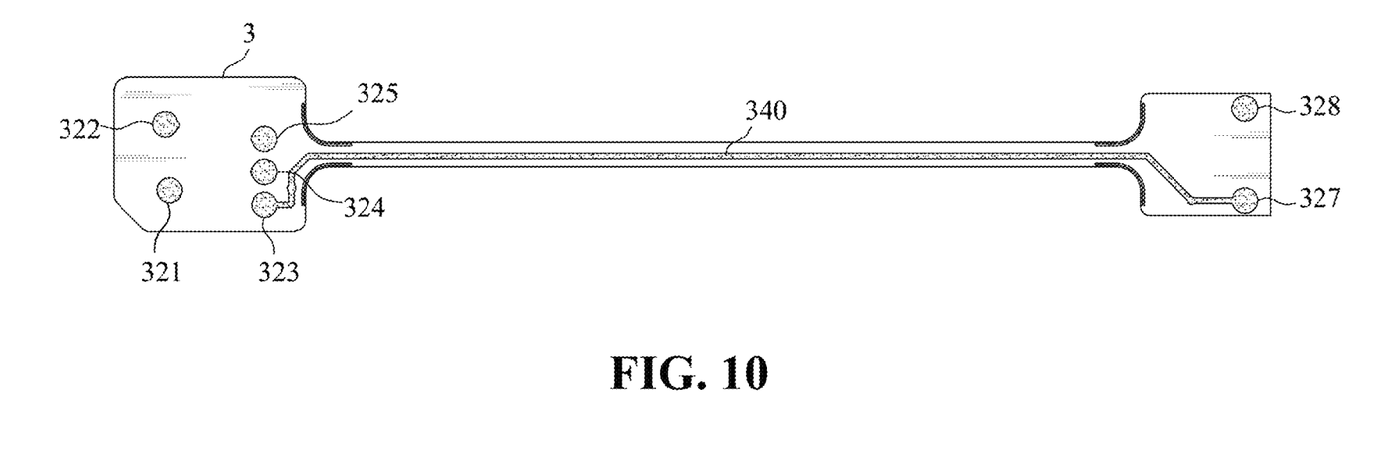
FIG. 10 illustrates a second connection circuit employed in another modified circuit structure of the present invention shown in FIG. 8.

FIG. 10 illustrates a second connection circuit employed in another modified circuit structure of the present invention shown in FIG. 8. The second connection circuit 3 is formed with the plurality of SIM-host contacts 321, 322, 323, 324, 325 for connecting electrically with the insert slots C5, C7, C1, C2, C3 of the SIM card (not visible) and two card-contact points 327, 328 for connecting electrically and respectively to two insert pins PIN9, PIN10 of a microSD memory card (not visible).

In addition, the second connection circuit 3 further includes a conduction circuit path 340 that interconnects electrically the SIM-host contact 323 with the card-contact point 327, wherein the SIM-host contact 323 is in electrical contact with the insert slot C1 (Vcc) of the SIM card, while the card-contact point 327 has the signal Vcc and is in electrical contact with the insert pin PIN10 of the microSD memory card so that the signal Vcc is transmitted from the insert slot C1 (Vcc) of the SIM card to the insert pin PIN10 of the microSD memory card via the conduction circuit path 340.

In the above-mentioned embodiments, since the flexible printed circuit substrate is composed of multiple laminated layers and the used SIM card is fabricated by utilizing NFC technology and is hence known as NFC SWP SIM card while the microSD memory card is fabricated in accordance with the Single Wire Protocol is generally known as SWP microSD flash card. Under this condition, the electrical connection among the SIM-host contacts and the card-contact points are performed under the NFC standards.

Regarding the SWP microSD flash card, the functions thereof can be increased during configuration and utilizing the circuit structure of the present invention for interconnecting the SWP microSD flash card with the SIM card having NFC SWP functions to enhance the overall function the mobile phone installed with the circuit structure of the present invention such that the user of the mobile phone can conduct mobile payment services (on-line financial transaction) in addition to verification of an individual identification information.

Regarding the number of above-mentioned SIM-host contacts and card-contact points and the length or configuration of the first and second connection circuits and the conduction circuit can be varied or adjusted depending on the practical requirements to complement with the SWP microSD flash card with the SIM card having NFC SWP functions. In the above embodiments, the number of the conduction circuit for interconnecting the first and second connection circuits should not be restricted. In other words, at least one of the SIM-host contacts should be electrically connected with at least one of the card-contact points.

In above-mentioned embodiments, the circuit structure of the present invention is utilized and hence the mobile phone utilizing the circuit structure of the present invention provides the following advantages:

(i) The transmission of signals and/or data between the SIM card and the microSD flash card, installed within the mobile phone utilizing the circuit structure of the present invention, is enhanced or strengthened.

(ii) Depending on the requirement of the user, the function quality of NFC-enabled device (NFC SIM card) and SWP microSD flash card to be installed in a mobile phone is increased when combines with the circuit structure of the present invention. The mobile phone thus produced can perform mobile payment services, such as contactless payment services and financial transaction in a safety environment owing to able to verifying individual financial information.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A circuit structure adapted to be implemented in circuit connection of a hand-held mobile communication device, the hand-held communication device having a SIM (Subscriber Identity Module) card slot and a microSD memory card slot, the circuit structure comprising:
   a first end having a shape corresponding to a SIM card and configured to be inserted into the SIM card slot;
   a second end having a shape corresponding to a microSD memory card and configured to be inserted into the microSD memory card slot;
   a first connection circuit fabricated on one side surface of a flexible printed circuit substrate on the first end and formed with a plurality of SIM-host contacts for electrically contacting contacts of the SIM card slot;
   a second connection circuit fabricated on the other side surface of the flexible printed circuit substrate on the first end and formed with a plurality of SIM-host contacts for electrically contacting contacts of a SIM card;
   a plurality of card-contact points formed on the second end for electrically contacting contacts of the microSD memory card slot; and
   a conduction circuit electrically interconnecting said first and second connection circuits.

2. A circuit structure adapted to be implemented in circuit connection of a hand-held mobile communication device, the hand-held communication device having a SIM card slot and a microSD memory card slot, the circuit structure comprising:
   a first end having a shape corresponding to a SIM card and configured to be inserted into the SIM card slot;
   a second end having a shape corresponding to a microSD memory card and configured to be inserted into the microSD memory card slot;
   a first connection circuit extending from the first end to the second end and fabricated on one side surface of a flexible printed circuit substrate on the first end and formed with a plurality of SIM-host-contacts for electrically contacting contacts of the SIM card slot, said first connection circuit further being formed with a plurality of card-contact points on the second end for electrically contacting contacts of the microSD memory card slot;
   a second connection circuit fabricated on the other side surface of the flexible printed circuit substrate on the first end and formed with said plurality of SIM-host contacts for electrically contacting contacts of a SIM card, said second connection circuit further being formed with said plurality of card-contact points on the second end for electrically contacting the contacts of said microSD memory card slot; and
   a conduction circuit electrically interconnecting said first and second connection circuits.

3. The circuit structure according to claim 2, wherein said first connection circuit includes a conduction circuit path, which electrically interconnects one of said plurality of SIM-host-contacts with one of said plurality of card-contact points.

4. The circuit structure according to claim 1 wherein said second connection circuit includes a conduction circuit path, which electrically interconnects one of said plurality of SIM-host contacts with one of said plurality of card-contact points.

5. The circuit structure according to claim 1, wherein the flexible printed circuit substrate is formed with a conduction hole that defines said conduction circuit, the flexible printed circuit substrate being implemented in the hand-held mobile communication device.

6. A circuit structure adapted to be implemented in circuit connection of a hand-held mobile communication device, the hand-held communication device having a SIM card slot and a microSD memory card slot, the circuit structure comprising:
   a first end having a shape corresponding to a SIM card and configured to be inserted into the SIM card slot;
   a second end having a shape corresponding to a microSD memory card and configured to be inserted into the microSD memory card slot;
   a first connection circuit fabricated on one side surface of a flexible printed circuit substrate on the first end and formed with a plurality of SIM-host-contacts for electrically contacting contact of the SIM card slot, said first connection circuit further being formed with a plurality of card-contact points on the second end for electrically contacting contacts of the microSD memory card slot;
   a second connection circuit fabricated on the other side surface of the flexible printed circuit substrate on the first end and formed with said plurality of SIM-host contacts for electrically contacting the contacts of the SIM card slot, said second connection circuit further being formed with said plurality of card-contact points on the second end for electrically contacting the contacts of said microSD memory card slot; and
   a conduction circuit electrically interconnecting said first and second connection circuits.

7. The circuit structure according to claim 6, wherein, said first connection circuit includes a conduction circuit path, which electrically interconnects one of said plurality of SIM-host contacts with one of said plurality of card-contact points.

8. The circuit structure according to claim 6, wherein said second connection circuit includes a conduction circuit path, which electrically interconnects one of said plurality of SIM-host contacts with one of said plurality of card-contact points.

9. The circuit structure according to claim 6, wherein the flexible printed circuit substrate is formed with a conduction hole that defines said conduction circuit, the flexible printed circuit substrate being implemented in a hand-held mobile communication device.

\* \* \* \* \*